(12) United States Patent
Soulier-Bouchet et al.

(10) Patent No.: US 8,420,500 B2
(45) Date of Patent: Apr. 16, 2013

(54) METHOD OF PRODUCING A STRUCTURE BY LAYER TRANSFER

(75) Inventors: Brigitte Soulier-Bouchet, Grenoble (FR); Sébastien Kerdiles, Saint-Ismier (FR); Walter Schwarzenbach, Saint Nazaire les Eymes (FR)

(73) Assignee: Soitec, Bernin (FR)

( * ) Notice: Subject to any disclaimer, the term of this patent is extended or adjusted under 35 U.S.C. 154(b) by 525 days.

(21) Appl. No.: 12/675,927

(22) PCT Filed: Sep. 11, 2008

(86) PCT No.: PCT/EP2008/062018
§ 371 (c)(1),
(2), (4) Date: Mar. 1, 2010

(87) PCT Pub. No.: WO2009/034113
PCT Pub. Date: Mar. 19, 2009

(65) Prior Publication Data
US 2010/0304507 A1    Dec. 2, 2010

(30) Foreign Application Priority Data
Sep. 12, 2007  (FR) ...................... 07 57511

(51) Int. Cl.
*H01L 21/30* (2006.01)
(52) U.S. Cl.
USPC .............. 438/455; 438/458; 257/E21.122
(58) Field of Classification Search .......... 438/455–465; 257/E21.122
See application file for complete search history.

(56) References Cited

U.S. PATENT DOCUMENTS

| 5,298,465 A | 3/1994 | Levy ........................ 437/225 |
| 5,423,918 A | 6/1995 | Gupta et al. ..................... 134/1 |
| 2004/0082148 A1* | 4/2004 | Maleville .................... 438/455 |
| 2005/0266653 A1 | 12/2005 | Moriwaki .................... 438/406 |
| 2005/0268850 A1 | 12/2005 | Ma ............................. 118/723 |
| 2006/0141746 A1 | 6/2006 | Delattre et al. ............... 438/455 |
| 2007/0148912 A1* | 6/2007 | Morita et al. ................. 438/455 |

FOREIGN PATENT DOCUMENTS

| EP | 0 272 142 B1 | 6/1988 |
| EP | 0 649 165 A1 | 4/1995 |
| JP | 7249749 A | 9/1995 |
| WO | WO 2007/060145 A1 | 5/2007 |

OTHER PUBLICATIONS

International Search Report, PCT/EP2008/062018, mailed Jan. 19, 2009.

* cited by examiner

*Primary Examiner* — Brook Kebede
(74) *Attorney, Agent, or Firm* — Winston & Strawn LLP

(57) ABSTRACT

The invention relates to a method of producing a semiconductor structure by transferring a layer of a donor substrate to a receiver substrate, with the creation of an embrittlement zone in the donor substrate to define the transfer layer, and the treatment of the surface of one of the substrates to increase the bonding strength between them, followed by the direct wafer bonding of the substrates and the detachment of the donor substrate at the embrittlement zone to form the semiconductor structure, in which the surface of the receiver substrate, except for a peripheral crown, is covered with the transferred layer. The treatment of the substrate surface is controlled so that the bonding strength between the substrates is lower in a peripheral area than in a central area. The peripheral area has a width at least equal to the that of the crown and less than 10 mm.

16 Claims, 4 Drawing Sheets

500 μm

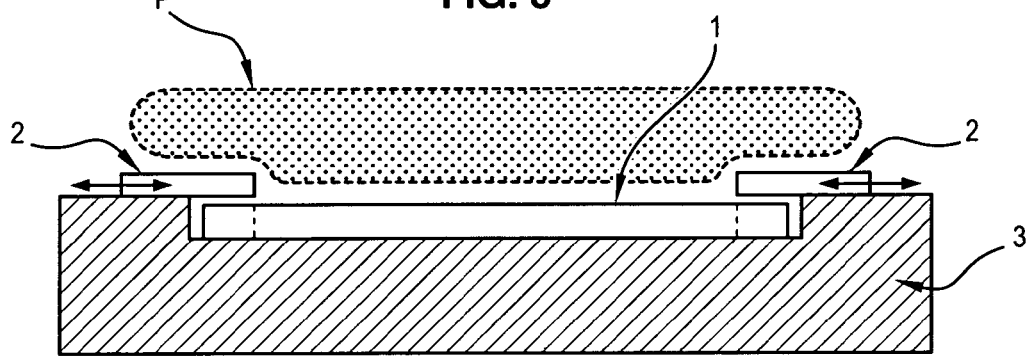
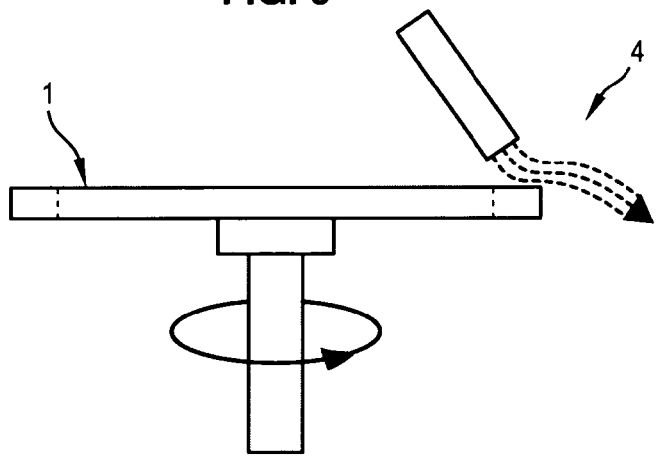

METHOD OF PRODUCING A STRUCTURE BY LAYER TRANSFER

This application is a 371 filing of International Patent Application PCT/EP2008/062018 filed Sep. 11, 2008.

FIELD OF THE INVENTION

This invention relates to a method of producing a structure by layer transfer. This method is especially used in the manufacture of SOI (silicon-on-insulator) structures using a Smart-Cut™ technique.

BACKGROUND TO THE INVENTION

SmartCut™ enables a fine layer of a donor substrate to be transferred to a receiver substrate and initiates the following stages:
a) Implantation of atomic species within the donor substrate, in order to create an embrittlement zone of the same depth as the thickness of the fine layer to be transferred.
b) Bringing into contact of the substrates and direct wafer bonding. The entire surface of the substrates is bonded, except for the periphery, as the wafers exhibit edge roll-off (ERO) and are not therefore in contact around their periphery, as can be seen in FIG. 1.
c) Detachment of the donor substrate in the embrittlement zone and transfer of the fine layer to the receiver substrate.

The substrates generally occur in the form of circular wafers; for example, 300 mm wafers are currently in use.

The peripheral area in which transfer of the fine layer has not taken place is called the crown. In relation to FIG. 2, which shows a top view of four peripheral areas of an SOI wafer, the crown CP is located between the perimeter 100 of the receiver substrate (outer edge of the crown) and the perimeter 200 of the transferred layer (inner edge). On the wafer in FIG. 2, the crown CP is even, in other words the SOI perimeter is even.

Prior to direct wafer bonding, it is possible to bring about plasma activation of the surface of at least one of the substrates. This activation enables the bonding strength to be improved significantly.

The bonding strength can also be improved by adapted cleaning prior to bonding, for example a type $O_3$/SC1/SC2 sequence in which the SC1 is carried out at a temperature of under 50° C.

However, it has been found that improving the bonding strength can produce an uneven crown width (referred to in the jargon as a "jagged edge") in the final product, in other words, the SOI obtained following detachment. What happens here is that following detachment, the crown also includes small isolated zones that have also been transferred. The width of the crown is therefore made uneven by the random, local enlargement of the transferred zone over several hundreds of micrometres towards the edge of the receiver substrate. The enlargement of the transferred zone is visible in the photos in FIG. 3, where the lighter area represents the transferred layer and the darker layer is the crown.

Document WO2007/06145 discloses a method for preventing the formation of edge voids in an SOI, which are non-transferred zones located preferentially at the periphery of the SOI.

One of the aims of the invention is therefore to improve the method of producing a structure by layer transfer, so as to guarantee that the edge of the transferred layer is even, without any local enlargement.

BRIEF DESCRIPTION OF THE INVENTION

A first object of the invention is a method of producing a semiconductor structure by transferring a layer of a donor substrate to a receiver substrate, including the following stages:
(a) creation of an embrittlement zone in the donor substrate, so as to define the aforementioned layer,
(b) treatment of the surface of the donor and/or receiver substrate, so as to increase the bonding strength between the two substrates,
(c) direct wafer bonding of the donor substrate to the receiver substrate,
(d) detachment of the donor substrate in the embrittlement zone, so as to form said semiconductor structure, in which the surface of the receiver substrate, except for a peripheral crown, is covered with the transferred layer (32), the aforementioned method being characterised in that at stage (b) treatment of the substrate surface is controlled, so that the increase in bonding strength between the donor substrate and the receiver substrate is lower in a peripheral area of these substrates than the increase in bonding strength in the central area of said substrates and in that said peripheral area has a width at least equal to the that of the crown and lower than 10 mm.

According to other possible features of the invention:
the bonding strength between the substrates is not increased in the peripheral area;
the bonding strength in the peripheral area is at least 15% lower than the bonding strength in the central area of the substrates;
said peripheral area has a width of between 0.2 and 10 mm;
the method includes, prior to stage (b), the experimental determination of the width of the crown;
experimental determination of the width of the crown involves producing a semiconductor reference structure by transferring a layer of donor substrate to a receiver substrate, comprising the following stages:
a) creation of an embrittlement zone in a donor substrate, so as to define said layer,
b) treatment of the surface of the donor and/or receiver substrate, so as to increase the bonding strength between the two substrates
c) direct wafer bonding of the donor substrate on the receiver substrate
d) detachment of the donor substrate in the embrittlement zone, so as to measure the width of the receiver substrate crown on said reference structure.
according to a first embodiment of the invention, the treatment at stage (b) involves plasma activation wherein the peripheral area is not exposed to the plasma;
according to a variant of the invention, stage (b) includes plasma activation or cleaning (preferably an SC1 cleaning carried out at a temperature of below 50° C.) of the entire substrate surface followed by deactivation of the peripheral area, said deactivation being carried out by chemical etching of the peripheral area; for this purpose, an etching solution is dispensed by a jet onto the peripheral area of the substrate while the substrate is rotated.

BRIEF DESCRIPTION OF THE FIGURES

Other features and advantages of the invention will emerge from the detailed description that follows in relation to the attached figures in which:

FIG. 8 illustrates a third execution of the invention;

FIG. 9 illustrates a fourth embodiment of the invention.

DETAILED DESCRIPTION OF THE INVENTION

Figure 1:
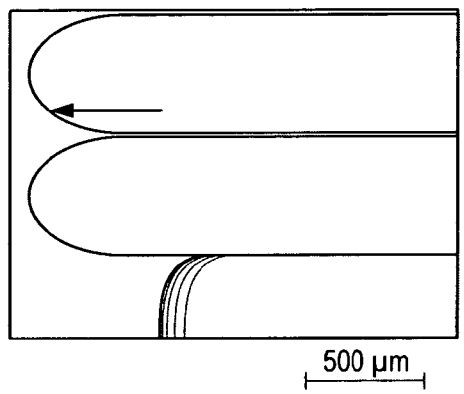
FIG. 1 is a photo of a section through two wafers showing the edge roll-off of the wafers at the start of the SOI crown
Figure 2:
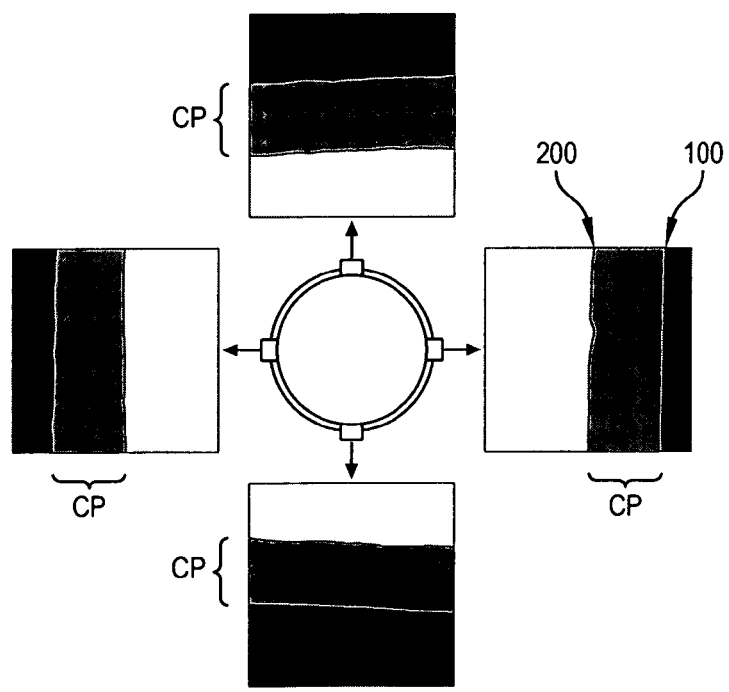
FIG. 2 is a top view of the edge of an SOI wafer showing an even crown
Figure 3:
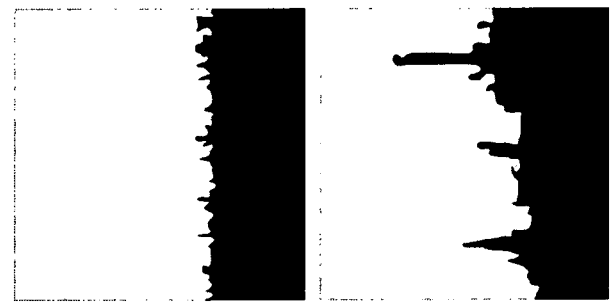
FIG. 3 is a photograph of the crown of a wafer displaying the jagged edge phenomenon
Figure 4:
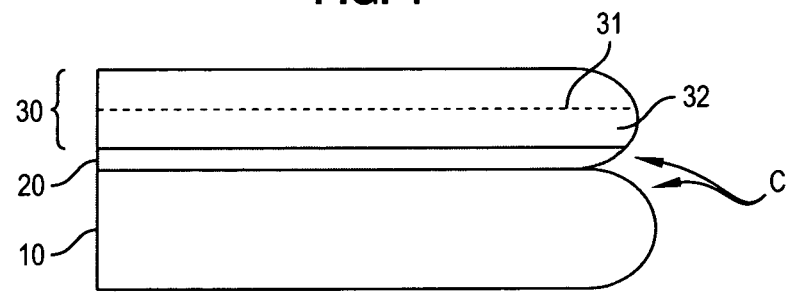
FIG. 4 is a sectional view of a structure after a donor substrate has been bonded onto a receiver substrate in the production of an SOI.

Notes on SOI Wafers:

FIG. 4 illustrates the structure obtained after a donor substrate 30 has been bonded to a receiver substrate 10.

When the Smart Cut™ technique is used, the donor substrate 30 may, for example, be covered with a layer 20 of oxide. In a manner familiar to the person skilled in the art, the oxide can be deposited or else formed by thermal oxidation of the donor substrate.

The donor substrate 30 then undergoes an implantation of atomic species, such as hydrogen and/or helium, for example, the dose and strength of which are adjusted so as to obtain an implantation peak at a depth matching the thickness of the layer of donor substrate to be transferred. Zone 31 into which the atomic species are implanted is called the embrittlement zone.

Once the surface of the donor substrate 30 and/or the receiver substrate 10 has undergone plasma activation, where appropriate, the substrates are brought into contact and direct wafer bonded.

The effect of the plasma activation is to increase the bonding strength between the two substrates.

This increase in bonding strength can also be obtained by means of $O_3$/RCA cleaning prior to bonding, in which the SC1 is carried out at a temperature below 50° C. This cleaning is well known to the person skilled in the art and will not therefore be described in detail here. It is simply pointed out that RCA involves a sequence of baths referred to as SC1 and SC2. SC1 is a mixture of $H_2O$, $H_2O_2$ and $NH_4OH$. SC2 is a mixture of $H_2O$, $H_2O_2$ and HCl. Rinsing stages in $H_2O$ are inserted between the SC1 and SC2 baths. $O_3$ cleaning corresponds to a first $H_2O$ bath in which the ozone gas is dissolved.

As can be seen in FIG. 4, the wafers of the two substrates do not have an edge that is perpendicular to the surface, but instead they display an edge roll-off, indicated by the arrows marked C. The substrates 10 and 30 are not therefore bonded right up to the edge, but up to the edge roll-off.

Figure 5:
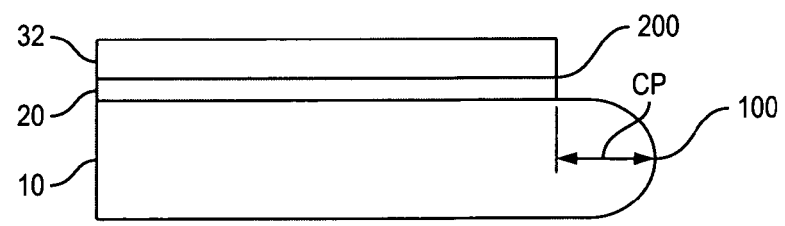
FIG. 5 is a sectional view of the above structure following the detachment and transfer of a fine layer.

The donor substrate 30 is then detached along the embrittlement zone 31. To achieve this, the detachment can be started by mechanical force or an increase in temperature; the detachment spreads across the entire surface in the form of a detachment wave. The SOI structure thereby obtained is represented in FIG. 5. Due to the existence of the edge roll-off at the wafer edges, the part transferred from the donor substrate 30 does not extend over the entire surface of the receiver substrate 10, but only as far as the edge of a peripheral crown CP.

For a 300 mm wafer, the peripheral crown CP is typically 1 mm wide relative to the edge of the wafer.

The jagged edge phenomenon revealed in the introduction is explained by the presence of transferred zones (in other words, oxide 20 and a fine layer 32) within the peripheral crown CP.

In the plasma activation processes commonly used, the plasma activates the substrate's entire useful surface (referred to as the "front") and the wafer edges, but not the back, which is not exposed to the plasma, because it is sitting on an electrode.

Detailed Description of the Invention

The jagged edge phenomenon would appear to be due to excessively strong bonding at the edge roll-off of the wafers.

In fact, in the event that bonding takes place following plasma activation or adapted cleaning of the donor and/or receiver substrate before bonding, the two wafers adhere to one another more strongly, which reduces the width of the crown following transfer.

This is explained by the fact that the edge roll-offs are not prominent angles, but rather gradual curves of the wafer edge.

If the bonded wafer edges display local irregularities, the transfer following plasma activation reproduces these possible irregularities in the crown, leading to a jagged edge.

If there is no activation, the bonding does not spread to these uneven edges (although one cannot exclude the possibility of surface irregularities existing further within the substrate, which are not revealed due to the local parallel configuration of the bonded surfaces) and the transfer produces crowns that are wider and, above all, more even, in other words, without jagged edges.

In general terms, the invention makes it possible to avoid the jagged edge phenomenon by controlling the activation or cleaning of the surface of the substrate that has been treated, so as to control the bonding strength between the two substrates. It is envisaged, in fact, that if a weak bonding strength can be maintained or achieved around the periphery of the substrates, the risk of transferred zones emerging in the crown will be limited.

To this end, a first solution is to keep the bonding strength low in the peripheral area by not carrying out activation in this area.

An alternative would be to reduce locally the higher bonding strength obtained by activation or by cleaning prior to bonding.

In both cases, the activation or cleaning prior to bonding is controlled, so that at the end the increase in bonding strength between the substrates is weaker in the peripheral area than in the central area of these substrates. Typically, the bonding strength in the peripheral area will be at least 15% lower than the bonding strength in the central area of the substrates.

A first embodiment of the invention consists of the plasma activation of one and/or the other substrate being bonded over its (their) entire surface except for the peripheral area.

A variant of the invention consists of plasma activation or cleaning before bonding of the entire surface of one and/or the other of the substrates to be bonded, followed by localised deactivation (prior to bonding) only in the peripheral area.

The peripheral area in which the deactivation or non-activation takes place will typically be between 0.2 and 10 mm wide, more particularly between 0.5 and 2.5 mm and preferably 2 mm.

This width typically corresponds to a width greater than or equal to that of the crown which, at the start of the detachment, generally displays a width of between 0.2 and 2 mm and more particularly between 0.8 and 1.2 mm.

In practical terms, it may be advantageous to produce a reference structure beforehand using the same procedure as for the structure it is hoped to obtain, in other words:

i) creation of an embrittlement zone in a donor substrate so as to define a layer,
ii) treatment of the surface of the donor and/or receiver substrate, so as to increase the bonding strength between the two substrates
iii) direct wafer bonding of the donor substrate on the receiver substrate
iv) detachment of the donor substrate in the embrittlement zone.

The width of the crown on the receiver substrate is then measured on this reference structure, after which the width of the peripheral area is determined, so that it is greater than or equal to the width of the crown measured on the reference structure.

It is likewise possible to proceed through repetition, in other words, by setting an arbitrary width for the peripheral area, 2 mm for example, then initiating the procedure described in the invention and measuring the width of the resulting crown. For the following structures, the width of the peripheral area is adjusted, so that it is greater than or equal to the width of this crown.

First Embodiment:Non-Activation of the Peripheral Area

A first possible embodiment of the invention involves conducting plasma activation before bonding, this being controlled so that the edges of one or both substrates subjected to the plasma are not activated by it.

Hence, the bonding strength between the substrates in this peripheral area increases to a lesser extent than in the central area, if it increases at all.

The initiation of this sort of plasma activation depends on the type of equipment used for the plasma treatment.

Where plasma is generated by a source that is smaller than the substrates to be treated, sweeping the whole surface routinely enables the entire substrate, including its periphery, to be uniformly treated.

Figure 6:
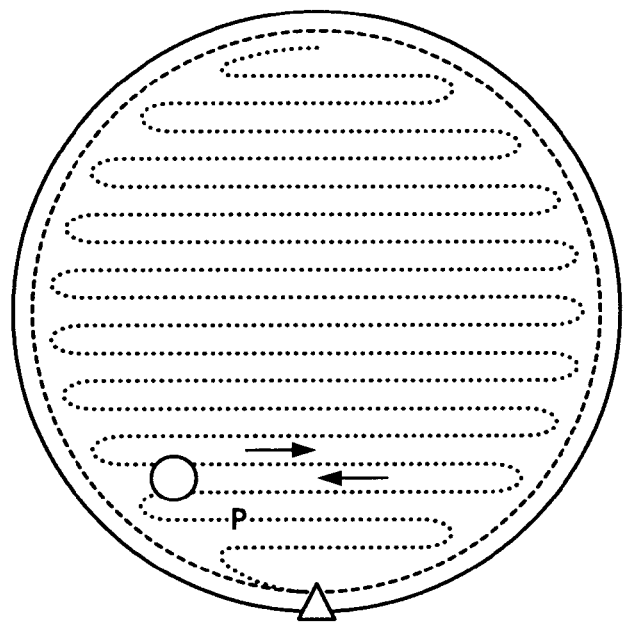
FIG. 6 illustrates a first embodiment of the invention.

The invention therefore involves modifying the sweeping action so that the wafer edges are not treated with plasma, such as by sweeping the substrate surface excluding the few last millimetres from the edge, in other words, at least the width of the future crown, with a "punctiform" plasma source. A punctiform source refers here to a source with a surface area measuring a few mm$^2$. FIG. 6 illustrates this case: the dotted lines depict the trajectory of a punctiform plasma source P sweeping the entire surface of the substrate except for the peripheral area.

In the case of plasma generated by a linear source longer than the greatest substrate dimension (i.e. the diameter in the case of circular wafers), movement in one direction makes it routinely possible to treat the whole surface of the substrates uniformly in one or several sweeps.

The invention therefore involves splitting up this linear source into a succession of small punctiform sources and sweeping the surface to be treated by switching on the small sources only when they are not facing the periphery of the substrates.

Figure 7:
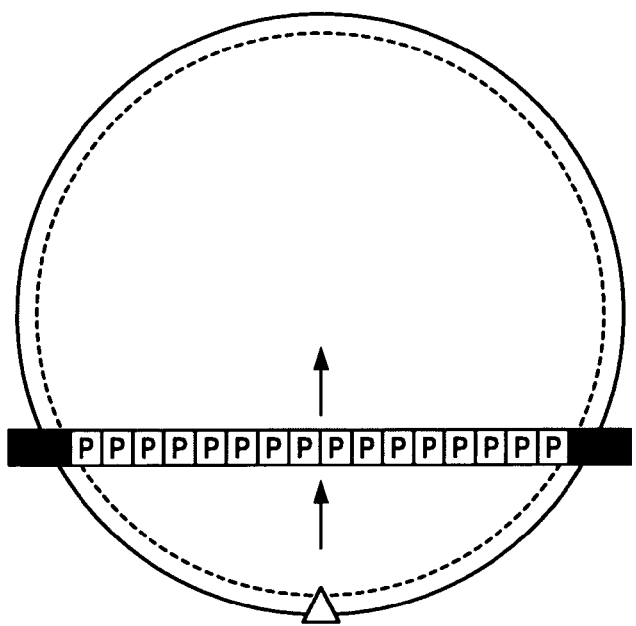
FIG. 7 illustrates a second embodiment of the invention.

With reference to FIG. 7, the linear plasma source is made up of a succession of small punctiform sources P. The linear source is moved in the direction of the arrows. Only the P sources facing a zone to be activated are switched on (they are represented by the pale coloured squares). The sources opposite the edge (represented by black squares) do not produce any plasma, so that the periphery is left untreated.

In the commonest case in which plasma is generated by a fixed source with a size comparable to the substrates, the invention involves eliminating or confining the plasma, so that it does not activate the periphery of the wafer 4.

To this end, the invention envisages, for example, confining the plasma by preventing it from treating the edge of the wafer.

With regard to FIG. 8, this confinement may be achieved, for example, by means of an annular screen 2 attached to the electrode 3 on which the substrate being treated 1 is placed and covering the edge of this substrate without touching it. This screen, the internal diameter of which is equal to the diameter of the surface being activated, is designed to have the same potential as the electrode supporting the substrate. The space between the wafer and the screen overhanging it—the width of which is equal to the width of the peripheral area—will therefore be free from plasma P.

This screen may, for example, be made from the same material as the substrate being treated, a configuration that will make it possible to restrict contamination of the latter.

This screen, divided into two diametrically opposed, mobile sections, may be set in place before and removed after the plasma treatment, thereby facilitating manipulation of the substrates following in the equipment.

This screen need not necessarily be made from solid material; it may also be a grid in which the greatest mesh size is smaller than the Debye length, so that it is seen by the plasma as a solid material, but permits the circulation of neutral species (the use of a grid makes it possible to achieve fewer disturbances in the gas flow). The conductive material from which the skeleton of the grid is made can then be covered with a coating to prevent any contamination of the substrate—an Si or SiC film for Si substrates, for example.

Second Embodiment: Deactivation of the Peripheral Area

According to a variant of the invention, the growth in bonding strength is achieved through plasma activation or adapted cleaning of the entire surface and of one and/or the other substrates to be bonded prior to bonding, followed by localised deactivation (prior to bonding) only in the peripheral area, for example with aid of chemical cleaning.

In fact, plasma activation involving surface modification to a depth of some tens of angstroms can be partly or completely destroyed by chemical etching of all or part of the plasma-modified thickness at the edges of the substrates, so as to achieve an even crown width.

Likewise, in the context of adapted cleaning prior to bonding, deactivation can be achieved by a slight increase in the micro-roughness of the surface in the peripheral area (average roughness typically increased in the order of 0.3 angstrom in the peripheral area).

From a practical point of view, in relation to FIG. 9, with the aid of wet cleaning using a jet while the substrate 1 is rotating, the jet of chemical products can be accurately directed only at the periphery of substrate 1, where the peripheral area is to be deactivated.

The chemical products dispensed are such that they will etch the material(s) present on the surface activated by plasma or cleaning. For example, in the presence of $SiO_2$ a mixture based on $NH_4OH$, $H_2O_2$, $H_2O$ can be used (e.g. SC1 diluted at 20-80° C.) or even a very dilute HF acid-based solution (e.g. HF 0.5% to etch 4 nm followed by the dispensing of ozonised water, in order to restore the hydrophilia of the wafer edge prior to bonding).

The etching solution remains localised in the peripheral area, thanks to the centrifugal force generated by the substrate's rotation.

What is claimed is:
1. A method of producing a semiconductor structure by transfer of a layer from a donor substrate having a surface bonded to a surface of a receiver substrate, which comprises:

providing donor and receiver substrates having surfaces for bonding, wherein the surfaces of the substrates have central and peripheral areas;

creating an embrittlement zone beneath the donor substrate surface to define the layer to be transferred, treating the surface of at least one of the donor substrate and the receiver substrate to increase bonding strength between the substrates after bonding, with the treating controlled to provide a higher increase in bonding strength at the central area(s) the substrates compared to the bonding strength at the peripheral area(s) of the substrates, after treating the surface, direct wafer bonding of the donor substrate to the receiver substrate by contact of their surfaces, and detaching the layer from the donor substrate at the embrittlement zone to form a semiconductor structure comprising the transfer layer and the receiving substrate and in which the surface of the receiver substrate, except for a peripheral crown, is provided with the transfer layer, wherein the peripheral area of the substrates has a width that is at least equal to that of the crown and between 0.5 to 2.5 mm.

2. The method of claim 1, wherein one substrate surface is treated to increase bonding strength between the substrates.

3. The method of claim 1, wherein both substrate surfaces are treated to increase bonding strength therebetween.

4. The method of claim 1, wherein the bonding strength between the substrates is not increased in the peripheral area.

5. The method of claim 1, wherein the bonding strength at a peripheral area of these substrates is increased by a lesser amount than that of the central area of the substrates.

6. The method of claim 5, wherein the bonding strength in the peripheral area is at least 15% lower than the bonding strength in the central area of the substrates.

7. The method of claim 1, wherein the peripheral area of the substrates has a width of between 0.2 and 10 mm.

8. The method of claim 7, which further comprises, prior to treating of the substrate surface(s), experimentally determining the crown width.

9. The method of claim 8, wherein the experimental determination of the width of the crown comprises producing a semiconductor reference structure by transfer of a layer from the donor substrate having a surface bonded to a surface of the receiver substrate, which comprises:

providing donor and receiver substrates having surfaces for bonding, wherein the surfaces of the substrates have central and peripheral areas;

providing an embrittlement zone beneath the donor substrate surface to define the layer to be transferred, treating the surface of at least one of the donor substrate and the receiver substrate to increase bonding strength between the two substrates after bonding, wherein the treatment of the substrate(s) is controlled so that the increase in bonding strength between the donor substrate and receiver substrate is lower in the peripheral area of these substrates than the increase in bonding strength in the central area of these substrates compared to the bonding strength at a peripheral area of the substrates, bonding of the donor substrate to the receiver substrate by contact of their surfaces, detaching the layer from the donor substrate at the embrittlement zone to form a semiconductor structure comprising the transfer layer and the receiving substrate and in which the surface of the receiver substrate, except for a peripheral crown, is provided with the transfer layer, and measuring the peripheral crown width of the receiver substrate of the reference structure.

10. The method of claim 9, wherein the treating of the substrate(s) is conducted without increasing the bonding strength of the peripheral area corresponding to at least the width of the peripheral crown measured from the semiconductor reference structure.

11. The method of claim 1, wherein the treating of the substrate surface(s) comprises plasma activation without exposure of the peripheral area(s) of the substrate(s).

12. The method of claim 11, which further comprises wet cleaning of the entire surface of the substrate(s) by applying an SC1 solution at a temperature below 50° C.

13. The method of claim 1, which further comprises plasma activation of the entire surface of one substrate, followed by a deactivation of the peripheral area of that substrate.

14. The method of claim 13, wherein the deactivation is accomplished by chemical etching of the peripheral area.

15. The method of claim 14, wherein the chemical etching comprises applying an etching solution onto the peripheral area of the substrate while the substrate is rotated.

16. A method of producing a semiconductor structure by transfer of a layer of a donor substrate to a receiver substrate, which comprises:

providing donor and receiver substrates having surfaces for bonding, wherein the surfaces of the substrates have central and peripheral areas;

creation of an embrittlement zone in the donor substrate to define the layer to be transferred, treatment of the surface of at least one of the donor substrate and the receiver substrate to increase bonding strength between the substrates, after treatment of the surface, direct wafer bonding of the donor substrate to the receiver substrate, and detachment of the donor substrate in the embrittlement zone to form a semiconductor structure and in which the surface of the receiver substrate, except for a peripheral crown, is covered with the transfer layer, wherein the treatment of the substrate(s) is controlled so that the increase in bonding strength between the donor substrate and receiver substrate is lower in the peripheral area of these substrates than the increase in bonding strength in the central area of these substrates compared to the bonding strength at a peripheral area of the substrates, and wherein the peripheral area of the substrates has a width that is at least equal to that of the crown and between 0.5 to 2.5 mm.

* * * * *